United States Patent
Tsai et al.

[11] Patent Number: 5,486,266
[45] Date of Patent: Jan. 23, 1996

[54] METHOD FOR IMPROVING THE ADHESION OF A DEPOSITED METAL LAYER

[75] Inventors: Chia S. Tsai; Tien C. Chang, both of Hsin Chu, Taiwan

[73] Assignee: Taiwan Semiconductor Manuf. Company, Hsinchu, Taiwan

[21] Appl. No.: 299,267

[22] Filed: Sep. 1, 1994

[51] Int. Cl.$^6$ .................................................. H01L 21/00
[52] U.S. Cl. ........................ 156/657.1; 134/3; 134/28; 156/662.1; 427/309; 437/228; 437/238
[58] Field of Search .................................. 134/3, 26, 27, 134/28, 29; 156/657.1, 662.1, 625.1, 651.1; 216/34, 35; 427/309; 437/228 ST, 238

[56] References Cited

U.S. PATENT DOCUMENTS 5,229,334  7/1993  Kato ........................................ 437/239
5,294,570  3/1994  Fleming et al. ......................... 437/239
5,308,400  5/1994  Chen ..................................... 134/28 X

OTHER PUBLICATIONS

Silicon Processing for VLSI Era vol. 1–Process Technology by S. Wolf & R. N. Tauber, pub by Lattice Press, 1986–Citation 4 "Kern & Puotin (RCA Review p. 187, Jun. 1970".
Silicon Processing for VLSI Era vol. 1–Process Technology by S. Wolf & R. N. Tauber, Pub by Lattice Press, 1986–Citation 10, "Vossen (J. Vac. Science & Technology, vol. A2, No. 2, 1984, p. 212)".

Primary Examiner—William Powell
Attorney, Agent, or Firm—George O. Saile

[57] ABSTRACT

The surface of a partially manufactured integrated circuit is cleaned by successive immersions in a series of specially formulated baths. Metallic films deposited on surfaces that have been cleaned in this manner do not exhibit subsequent peeling or blistering and have low electrical contact resistance to the surface onto which they were deposited.

26 Claims, 2 Drawing Sheets

METHOD FOR IMPROVING THE ADHESION OF A DEPOSITED METAL LAYER

BACKGROUND OF THE INVENTION

1. Field of the Invention

The present invention relates to a method for cleaning the surface of a partially manufactured integrated circuit just prior to the deposition of a metal layer. A particular feature of the method is that it eliminates subsequent peeling of the metal layer without introducing a high electrical contact resistance between the metal layer and the integrated circuit.

2. Description of the Prior Art

It has long been recognized in the manufacture of integrated circuits that as successive layers of material are deposited it is essential that each surface that is about to receive a fresh deposit be absolutely clean. A particular problem is that various liquids that come in contact with these surfaces, as part of the routine processing needed for the creation of integrated circuits, may, in some instances, leave insoluble and often invisible residues behind. These could be the result of trace impurities in the liquids or they could be the byproducts of chemical side reactions that occurred during processing.

If appropriate measures are not taken to completely remove these residues, a subsequently deposited layer will not adhere well to the surface and will be subject to peeling, blistering, etc. Thus, a number of procedures have been developed for cleaning the surface of an integrated circuit just prior to film deposition. An example of such a cleaning procedure is the one described by Kern and Puotin (RCA Review P. 187 June 1970):

1) Any residual photoresist is removed by immersion in an inorganic resist stripper such as a mixture of Sulphuric acid ($H_2SO_4$) and Hydrogen Peroxide ($H_2O_2$). Wafers are then rinsed in 18–20 megohm-cm. deionized water.

2) This is followed by immersion in a mixture of water, Ammonium Hydroxide ($NH_4OH$), and $H_2O_2$ (5:1:1 by volume) for 10–15 minutes at a temperature of 75–80° C. and then rinsed as before.

3) The next step is a brief dip in Hydrofluoric Acid (diluted with water 1:10) followed by a brief rinse.

4) Then, wafers are immersed in a mixture of water, hydrochloric acid (HCl), and $H_2O_2$ (6:1:1 by volume) for 10–15 minutes at a temperature of 75°–80° C. followed by a rinse, as before.

5) Finally, wafers are dried by heating in nitrogen and are then ready to receive the next deposited layer.

While the method that has been achieved in this invention bears some resemblance to the above, it differs in several of the details and, more particularly, as will be seen when the experimental data is presented below, it teaches that the order in which certain of the steps is performed is crucial, as well as different from that described above.

Quite a different approach to the cleaning of surfaces prior to film deposition is sputter etching. In this method a very thin layer (typically 1–200 Angstrom Units) is removed by sputtering. Since the contaminating residue layers are typically thinner than this, their removal is guaranteed, along with a small amount of the underlying surface. There are two problems associated with this method. It can be difficult to control so there is a tendency to overetch which can lead to serious problems. Additionally, recontamination of the surface can occur as a result of backscattering of some of the sputtered material. It has been reported by, for example, Vossen (J. Vac. Sci. & Tech. vol. A2 no. 2 1984 p. 212) that such backscattering can lead to increased contact resistance between freshly deposited films and previously deposited ones.

A particular feature of the method of this invention is that it does not lead to an increase in the contact resistance between successively deposited films.

SUMMARY OF THE INVENTION

A principal object of the present invention is to provide a method for cleaning the surface of a partially manufactured integrated circuit so that a subsequently deposited metal film will adhere well to said surface and will not later be subject to peeling and or blistering.

Another object of the present invention is to provide a method for cleaning the surface of a partially manufactured integrated circuit so that a subsequently deposited metal film will adhere well to said surface with a minimum of electrical contact resistance.

DESCRIPTION OF THE PREFERRED EMBODIMENTS

Figure 1:
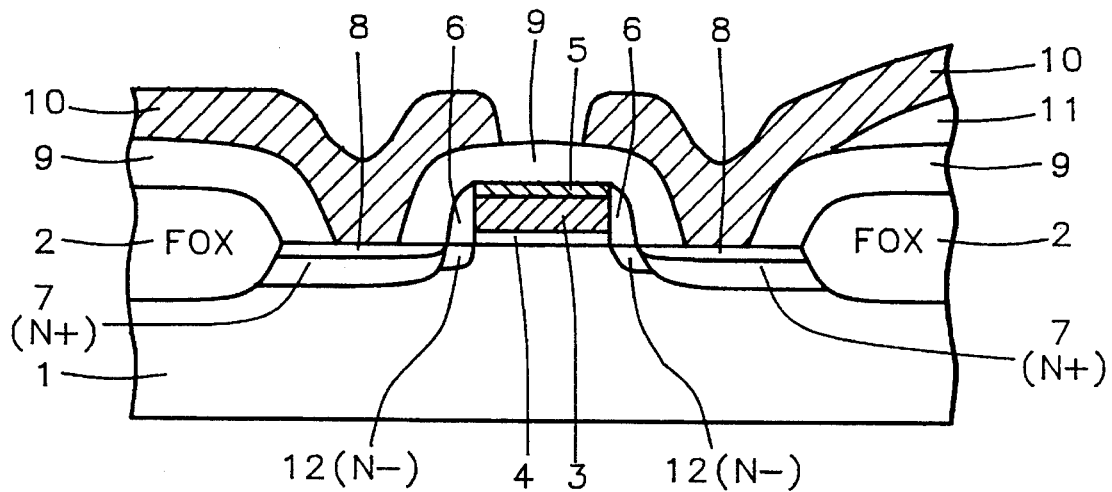
FIG. 1 shows a cross-section through a typical field effect transistor and points to the general area where peeling of a deposited metal layer can occur.

Referring now to FIG. 1, there is shown there a cross-section through a typical lightly doped drain (LDD) field effect transistor (FET) such as could be part of an integrated circuit. The substrate on which the FET was built is a body of P type silicon 1. On each side of the FET is an area of thick silicon dioxide ($SiO_2$) 2, commonly referred to as Field Oxide (FOX) whose purpose is to electrically isolate the particular FET from other devices in the same integrated circuit.

Midway between the two regions of FOX 2 is a layer of polycrystalline silicon 3 that serves as the gate electrode of the device. Immediately beneath 3 is a thin layer of oxide 4 whose thickness will determine the threshold voltage for the device. The gate electrode 3 is contacted through a layer of metal silicide 5. The sidewalls of the gate electrode are covered with oxide spacers 6 which keep the gate from shorting to the source/drain areas. The source/drain regions are made up of the N+ regions 7 and N– regions 12 (generally created by means of ion implantation, as is well understood in the art) which are contacted through a metal silicide layer 8.

The entire device is coated with a layer of silicon oxide 9. holes are then etched in 9 so as to allow contact to the source, drain, and gate areas by means of a deposited layer of metal 10 (usually aluminum). The contact hole for contacting the gate electrode is not shown in this cross-section.

Just prior to the deposition of 10 it is necessary to properly prepare the surface of the device. If this is not done, 10 is likely to lose adhesion to the surface of 9 and peel off in a manner illustrated in FIG. 1 as occurring in (but not restricted to) the region 11. An additional consequence of not properly preparing the surface of the device prior to the deposition of the metal layer is that a layer of relatively high electrical resistivity may be inserted between layers 7 and 8. Because the area of the via hole is very small, the absolute value of the resulting contact resistance can be significant and it may be greater than what has been specified to be the maximum acceptable contact resistance.

It is, therefore, an object of this invention to provide a method for preparing the surface of the passivating layer so that a subsequently deposited metal film will adhere to it firmly and uniformly and will not exhibit significant contact resistance to the receiving surface. It should be understood that while the application of the invention has been described through means of an example based on an FET device contained within an integrated circuit, the scope of the invention is not limited to FETs or even integrated circuits.

Figure 2:
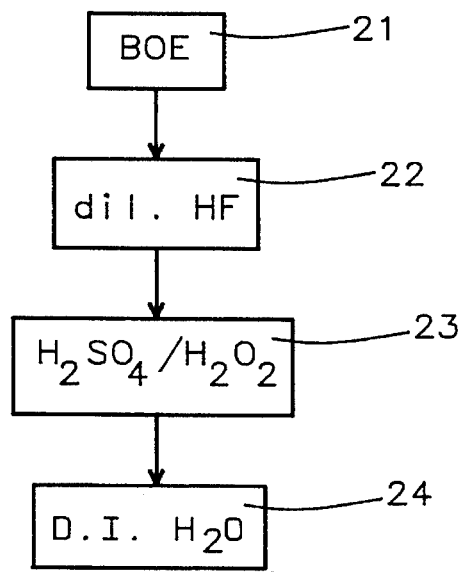
FIGS. 2, 3, and 4 are flowcharts that show the sequence of steps that must be followed in order to practice the invention.

One embodiment of the method of this invention is illustrated in FIG. 2 which shows a sequence of immersions in baths of differing composition. It should be noted that several of the chemicals that were used in these baths are commercially available only as aqueous solutions, being gases in their pure forms. See, for example, The Condensed Chemical Dictionary (10th Edition) by G. G. Hawley published by Van Norstrand in 1981. The compositions referred to below are thus in parts by volume of the strongest commercially available solutions, whose concentrations are as follows: HF 70%, $H_2O_2$ 90%, $NH_4OH$ 30%, and HCl 38%. It should be understood that less concentrated versions of these chemicals could be used to make up the baths described below, by adjusting the composition of the baths accordingly, without departing from the spirit and scope of the present invention:

(a) In step 21 the surface is dipped in a buffered oxide etch (BOE) consisting of 1 part by volume of HF, 1 part of $NH_4F$, and 8 to 12 parts water, for 10 to 20 seconds. This is followed by a rinse in deionized water and spin drying.

(b) In step 22 it is immersed in a solution of 1 part HF to 40 to 75 parts water for 50 to 75 seconds.

(c) This is followed by step 23, immersion for 40 to 60 seconds in a mixture containing 4 to 8 parts of $H_2SO_4$, 1 to 2 parts of $H_2O_2$, and 7 to 14 parts of water.

(d) In step 24 the surface is rinsed in 16 to 22 megohm-cm. deionized water and spin dried, following which the metal film is deposited.

Figure 3:
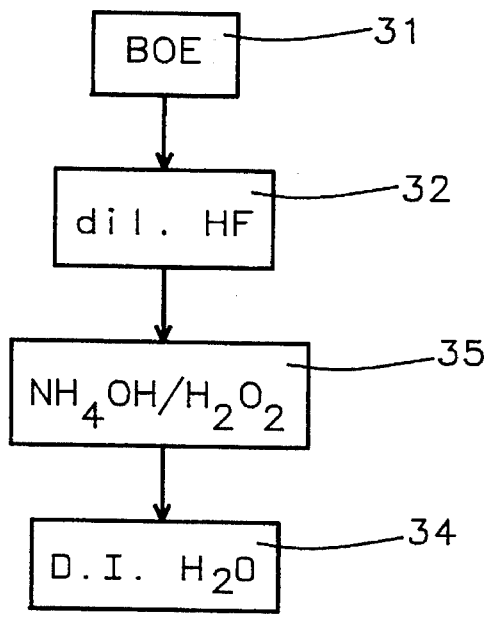

A second embodiment of the invention is illustrated in FIG. 3, as follows:

(a) In step 31 the surface is dipped in a buffered oxide etch (BOE) consisting of 1 part by volume of HF, 1 part of $NH_4F$, and 8 to 12 parts water, for 10 to 20 seconds. This is followed by a rinse in deionized water and spin drying.

(b) In step 32 it is immersed in a solution of 1 part HF to 40 to 75 parts water for 50 to 75 seconds.

(c) In step 35 this is followed by immersion for 1.5 to 2.5 minutes in a mixture containing 1 to 2 parts of $NH_4OH$, 1 to 2 parts of $H_2O_2$, and 8 to 16 parts of water.

(d) In step 36 the surface is rinsed in 16 to 22 megohm-cm. deionized water and spin dried, following which the metal film is deposited.

Figure 4:
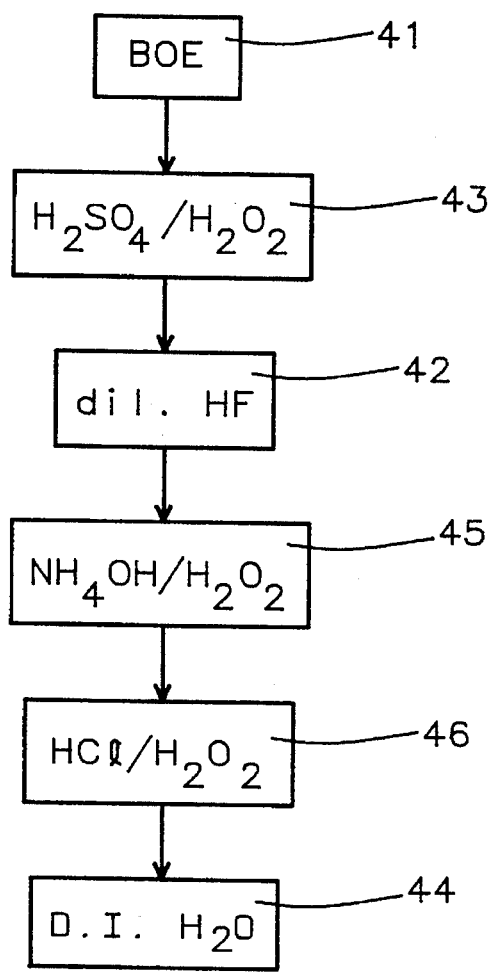

Referring now to FIG. 4, a third embodiment of the invention is illustrated as follows:

(a) In step 41 the surface is dipped in a buffered oxide etch (BOE) consisting of 1 part by volume of HF, 1 part of $NH_4F$, and 8 to 12 parts water, for 10 to 20 seconds. This is followed by a rinse in deionized water and spin drying.

(b) In step 43 this is followed by immersion for 30 to 60 seconds in a mixture containing 3 to 5 parts of $H_2SO_4$, 1 part of $H_2O_2$, and 5 to 10 parts of water.

(c) In step 42 it is then immersed in a solution of 1 part HF to 40 to 75 parts water for 50 to 75 seconds.

(d) In step 45 this is followed by immersion for 1.5 to 2.5 minutes in a mixture containing 1 part of $NH_4OH$, 1 part of $H_2O_2$, and 6 to 10 parts of water.

(e) In step 46 it is then immersed for 50 to 75 seconds in a mixture containing 1 part of hydrochloric acid (HCl), 1 part of $H_2O_2$, and 6 to 10 parts water.

(f) In step 44 the surface is rinsed in 16 to 22 megohm-cm. deionized water and spin dried, following which the metal film is deposited.

Table 1 below summarizes these various embodiments and compares them with several other similar looking 'recipes' by showing data for measured contact resistances as well as observations on the extent to which peeling, if any, occurred for the subsequently deposited metal film.

TABLE I

| Cleaning sequence | Contact resistance in ohms to these types of surface: | | | | Peeling? |
| --- | --- | --- | --- | --- | --- |
| | N+ | P+ | PO1 | PO2 | |
| BOE + A + B | 11.6 | 37.8 | 7.8 | 4.1 | slight |
| BOE + A + B + C + D | 11.7 | 38.6 | 8.7 | 4.2 | NO |
| BOE + B + C | 11.6 | 37.6 | 8.5 | 4.1 | NO |
| BOE + B + A | 11.6 | 39 | 8.5 | 4.2 | NO |
| Standard dip | 11.6 | 37.5 | 8.1 | 4.1 | YES |

BOE = 10:1 $H_2O$:HF 15 sec.; A = 4:1:7 $H_2SO_4$:$H_2O_2$:$H_2O$ 45 sec.; B = 50:1 $H_2O$:HF 1 min.; C = 1:1:8 $NH_4OH$:$H_2O_2$:$H_2O$ 2 min.;
D = 1:1:7 HCl:$H_2O_2$:$H_2O$ 1 min.; Standard dip = BOE 30 sec.; PO1 = Poly1 2400 Angstrom Units 24 ohm/sq. (floating gate); PO2 = Poly2 5000 Angstrom Units 21 ohm/sq. (1M EPROM)

As the data shows, contact resistance to all the various surfaces was essentially the same for all the methods used. It should also be mentioned that all these resistance values fell within the limits that had been specified as being necessary to meet manufacturing standards. In contrast, the peeling behaviour of the films was clearly dependent on the order in which the different cleaning procedures was carried out.

While the invention has been particularly shown and described with reference to the preferred embodiments thereof, it will be understood by those skilled in the art that various changes in form and details may be made without departing from the spirit and scope of the invention.

What is claimed is:

1. A method for cleaning the surface of a partially manufactured integrated circuit, just prior to the deposition of a metallic layer onto said surface, comprising:

dipping said surface in a buffered oxide etch composed of 1 part by volume of hydrofluoric acid, 1 part of ammonium fluoride, and water;

immersing said surface in a solution of hydrofluoric acid in water;

then immersing said surface in a mixture containing sulphuric acid, hydrogen peroxide, and water; and rinsing said surface in deionized water and then drying it.

2. The method of claim 1 where the buffered oxide etch contains from 8 to 12 parts of water.

3. The method of claim 1 where the duration of the dip in the buffered oxide etch is between 10 and 20 seconds.

4. The method of claim 1 where the hydrofluoric acid solution contains between 40 and 75 parts of water.

5. The method of claim 1 where the duration of the dip in hydrofluoric acid is between 50 and 75 seconds.

6. The method of claim 1 where the sulphuric acid/hydrogen peroxide bath is composed, by volume, of 4 to 8 parts of sulphuric acid, 1 to 2 parts of hydrogen peroxide, and 7 to 14 parts of water.

7. The method of claim 1 where the resistance of the deionized water is between 16 and 22 megohm-cm.

8. A method for cleaning the surface of a partially manufactured integrated circuit, just prior to the deposition of a metallic layer onto said surface, comprising:

dipping said surface in a buffered oxide etch composed of 1 part by volume of hydrofluoric acid, 1 part of ammonium fluoride, and water;

immersing said surface in a solution of hydrofluoric acid in water;

immersing said surface in a mixture of ammonium hydroxide, hydrogen peroxide, and water; and rinsing said surface in deionized water and then drying it.

9. The method of claim 8 where the buffered oxide etch contains from 8 to 12 parts of water.

10. The method of claim 8 where the duration of the dip in the buffered oxide etch is between 10 and 20 seconds.

11. The method of claim 8 where the hydrofluoric acid solution contains between 40 and 75 parts of water.

12. The method of claim 8 where the duration of the dip in hydrofluoric acid is between 50 and 75 seconds.

13. The method of claim 8 where the ammonium hydroxide/hydrogen peroxide bath is composed, by volume, of 1 to 2 parts of ammonium hydroxide, 1 to 2 parts of hydrogen peroxide, and 8 to 16 parts of water.

14. The method of claim 8 where the resistance of the deionized water is between 16 and 22 megohm-cm.

15. A method for cleaning the surface of a partially manufactured integrated circuit, just prior to the deposition of a metallic layer onto said surface, comprising:

dipping said surface in a buffered oxide etch composed of 1 part by volume of hydrofluoric acid, 1 part of ammonium fluoride, and water;

immersing said surface in a mixture of sulphuric acid, hydrogen peroxide, and water;

immersing said surface in a solution of hydrofluoric acid in water;

immersing said surface in a mixture of ammonium hydroxide, hydrogen peroxide, and water;

immersing said surface in a mixture of hydrochloric acid, hydrogen peroxide, and water; and rinsing said surface in deionized water and then drying it.

16. The method of claim 15 where the buffered oxide etch contains from 8 to 12 parts of water.

17. The method of claim 15 where the duration of the dip in the buffered oxide etch is between 10 and 20 seconds.

18. The method of claim 15 where the sulphuric acid/hydrogen peroxide mixture contains, by volume, from 3 to 5 parts of sulphuric acid, 1 part of hydrogen peroxide, and from 5 to 10 parts of water.

19. The method of claim 15 where the duration of the dip in the sulphuric acid/hydrogen peroxide mixture is between 30 and 60 seconds.

20. The method of claim 15 where the hydrofluoric acid solution contains between 40 and 75 parts of water.

21. The method of claim 15 where the duration of the dip in hydrofluoric acid is between 50 and 75 seconds.

22. The method of claim 15 where the ammonium hydroxide/hydrogen peroxide bath is composed, by volume, of 1 part of ammonium hydroxide, 1 part of hydrogen peroxide, and 6 to 10 parts of water.

23. The method of claim 15 where the duration of the dip in the ammonium hydroxide/hydrogen peroxide mixture is between 1.5 and 2.5 minutes.

24. The method of claim 15 where the hydrochloric acid/hydrogen peroxide bath is composed, by volume, of 1 part of hydrochloric acid, 1 part of hydrogen peroxide, and 6 to 10 parts of water.

25. The method of claim 15 where the duration of the dip in the hydrochloric acid/hydrogen peroxide mixture is between 50 and 75 seconds.

26. The method of claim 15 where the resistance of the deionized water is between 16 and 22 megohm-cm.

\* \* \* \* \*